United States Patent [19]
Scholler

[11] Patent Number: 6,126,746
[45] Date of Patent: Oct. 3, 2000

[54] DEVICE FOR HOLDING A CRYSTAL BLOCK

[75] Inventor: Johann Scholler, Eppertshausen, Germany

[73] Assignee: Leybold Systems GmbH, Hanau, Germany

[21] Appl. No.: 09/192,514

[22] Filed: Nov. 17, 1998

[30] Foreign Application Priority Data

Dec. 11, 1997 [DE] Germany ............ 197 54 961

[51] Int. Cl.[7] ........................... C30B 35/00
[52] U.S. Cl. .................. 117/218; 117/208; 117/911
[58] Field of Search ............... 117/208, 217, 117/218, 900, 911

[56] References Cited

U.S. PATENT DOCUMENTS 4,190,630  2/1980  Apilat et al. .

5,910,216  6/1999  Nakamura et al. ............ 117/218

FOREIGN PATENT DOCUMENTS 0 369 626   5/1990   European Pat. Off. .
1 769 860  11/1971   Germany .
196 21 351 12/1997   Germany .

*Primary Examiner*—Felisa Hiteshew
*Attorney, Agent, or Firm*—Smith Gambrell & Russell, LLP

[57] ABSTRACT

A pulling shaft extension (2) is fastened to a pulling shaft (1). This pulling shaft extension contains a driver (13) that protrudes outward similar to a flange and is in the form of a ball bearing. A carrying ring (6) of a gripping device (4) is arranged above the driver (13). If the pulling shaft (1) is moved upward, it drives the gripping device (4) upward as soon as its driver (13) contacts the holding ring (6). An actuating piston (18) makes it possible to move gripping arms (5) of the gripping device (4) into a clamping position such that the crystal block is held by the gripping arms.

11 Claims, 2 Drawing Sheets

DEVICE FOR HOLDING A CRYSTAL BLOCK

INTRODUCTION AND BACKGROUND

The present invention pertains to a device for holding a crystal block in a crystal pulling arrangement, wherein a vertically displaceable pulling shaft that contains cooling channels for a cooling medium is provided with a seed crystal holder, on which a crystal neck of smaller diameter and a crystal block of larger diameter are formed during the pulling of the crystal block.

When pulling crystal blocks, a problem arises in that the size of the crystal block being produced is limited by the crystal neck of smaller diameter which is initially formed on the seed crystal holder. If the crystal blocks become excessively large and consequently excessively heavy, the crystal neck is no longer able to hold the crystal block, i.e., the crystal neck fractures. In order to eliminate this problem, the crystal block being formed could conceivably be supported by a carrying device that engages on the outer surface of the crystal block. However, this is associated with certain technical difficulties because the carrying device can only be utilized once a sufficiently long crystal neck is formed. In addition, it needs to be ensured that the carrying device does not exert forces upon the crystal block transverse to its longitudinal axis which could lead to fracturing of the crystal neck.

An object of the present invention is therefore to develop a device for holding a crystal block which initially allows an unobstructed pulling of the crystal block and subsequently supports the crystal block of larger diameter, without introducing lateral forces into the crystal block.

SUMMARY OF THE INVENTION

The above and other objects of the invention can be achieved by a gripping device with at least two gripping arms that can be placed against a crystal block and arranged on the pulling shaft in axially displaceable fashion, namely, such that it can be placed onto a support from the top.

A feature of the invention resides in the fact that the outside of the pulling shaft contains a driver that is moved against a carrying ring of the gripping device due to the vertical movement of the pulling shaft.

It is a further feature of the present invention that the pulling shaft is provided with an actuating device for actuating the gripping arms.

A gripping device of this type initially does not influence the movement of the pulling shaft with its seed crystal holder during the formation of the crystal neck because the pulling shaft allows an unobstructed downward movement and a subsequent upward movement of the seed crystal holder after the gripping device is placed onto the crucible containing the molten mass that forms the crystals. Once the seed crystal holder is moved upward to such a degree that the formation of the crystal block of larger diameter can begin, the driver causes an upward movement of the gripping device synchronous to that of the pulling shaft. The closing movement of the gripping device which is only initiated at this point and may take place by different means causes the crystal block being formed to be held, i.e., the crystal neck no longer needs to support the weight of the crystal block or part of the weight of the crystal block. Consequently, the device according to the present invention makes it possible to pull heavy crystal blocks without risking that the crystal neck fractures.

Since crystal blocks are relatively heavy, it must be possible to generate high holding forces with the gripping device. This can be realized in the most uniform fashion by charging the actuating device with a pressure medium. The expenditure required for this process is particularly low if the actuating device contains at least one actuating piston that is displaced by increasing the pressure of the cooling medium.

The device according to the invention has a particularly simple constructive design if the actuating device contains only one actuating piston that is arranged coaxial to the pulling shaft, wherein the actuating piston contains clamping ramps on its outer surface which extend transverse to the longitudinal axis of the pulling shaft, and wherein one respective displaceable clamping finger that is arranged radially and actuates one gripping arm adjoins the clamping ramps.

If the actuation is realized by means of clamping ramps, it is unavoidable that one gripping arm contacts the crystal block earlier than the other gripping arms due to manufacturing tolerances or irregularities of the outer contour of the crystal block. Consequently, this gripping arm tends to press the crystal block toward one side, i.e., the crystal neck may fracture. According to one particularly advantageous additional development of the invention, this can be prevented in simple fashion, namely without the observation of strict manufacturing tolerances, if the actuating piston is fabricated in the form of a hollow piston that only adjoins the guide cylinder near its lower end face and can be tilted toward all sides, wherein the upper end of the hollow piston is connected to the guide cylinder in sealed fashion via a bellows. An actuating piston of this type carries out a tilting movement inside of its guide cylinder if only one gripping arm adjoins the crystal block. This tilting movement only ceases once all gripping arms uniformly adjoin the crystal, i.e., uniform clamping forces are only generated subsequently due to the additional movement of the actuating piston.

The tilting movement required for generating uniform holding forces as well as a low-friction movement of the actuating piston can be achieved with a low constructive expenditure if the actuating piston adjoins the guide cylinder with several balls that are inserted into recesses arranged in the outer surface of the actuating piston near its lower end face.

As long as the gripping device rests on a support situated above the crucible containing the molten mass, it is not rotationally driven by the pulling shaft. The transmission of the rotary movement while the gripping device is lifted off the support takes place smoothly if a ball bearing that can be moved against the carrying ring from the bottom is arranged on the holding shaft as the driver.

In order to additionally simplify the constructive design of the device, it is proposed that support arms extend from the carrying ring of the gripping device to a holding ring that is arranged at a lower elevation, and that this holding ring contains articulation axes for each gripping arm that contains a pressure element for adjoining the crystal block at the lower end of its lower lever arm and adjoins one respective clamping finger with its upper lever arm.

Depending on the respective requirements, pulling devices may be provided with the gripping device according to the invention or, when pulling smaller crystal blocks, operate without such a gripping device if the guide cylinder with the actuating piston, the gripping device and its actuating device form one structural unit together with a pulling shaft extension that is designed for being fastened to the pulling shaft.

The cooling of the device may be accomplished in simple fashion if the guide cylinder is closed by a face wall on its lower end, if the seed crystal holder is inserted into the guide cylinder so as to form a cooling medium chamber at a distance from this face wall, and if this cooling medium chamber is connected to a cooling medium supply via cooling channels.

The lower end face of the device which faces the crystal block and the seed crystal holder are also cooled in superior fashion if the pulling shaft contains a central cooling tube for supplying the cooling medium which extends into the actuating piston, namely up to the vicinity of its lower end face, and if the cooling channels extend from the upper end of the guide cylinder to the cooling medium chamber and additional cooling channels lead from the cooling medium chamber to a return channel that surrounds the cooling tube.

Since the pulling shaft rotates while a crystal block is pulled and the gripping device initially stands still, a relative movement between the clamping fingers and the gripping arms occurs before the gripping device is lifted off its support. Consequently, it needs to be ensured that the clamping fingers are able to actuate the gripping arms once this relative movement ceases. This may be realized by different means. If the pulling shaft and the gripping device run synchronously, they do not need to have an exact angular position relative to one another if the gripping arms contain crosspieces at the elevation of the clamping fingers which extend in the shape of an arc toward both sides at a distance from the pulling shaft extension.

BRIEF DESCRIPTION OF THE DRAWINGS

The invention allows numerous embodiments. In order to additionally elucidate the basic principle of the invention, one embodiment is illustrated in the figures and described below.

DETAILED DESCRIPTION OF THE INVENTION

Figure 1:
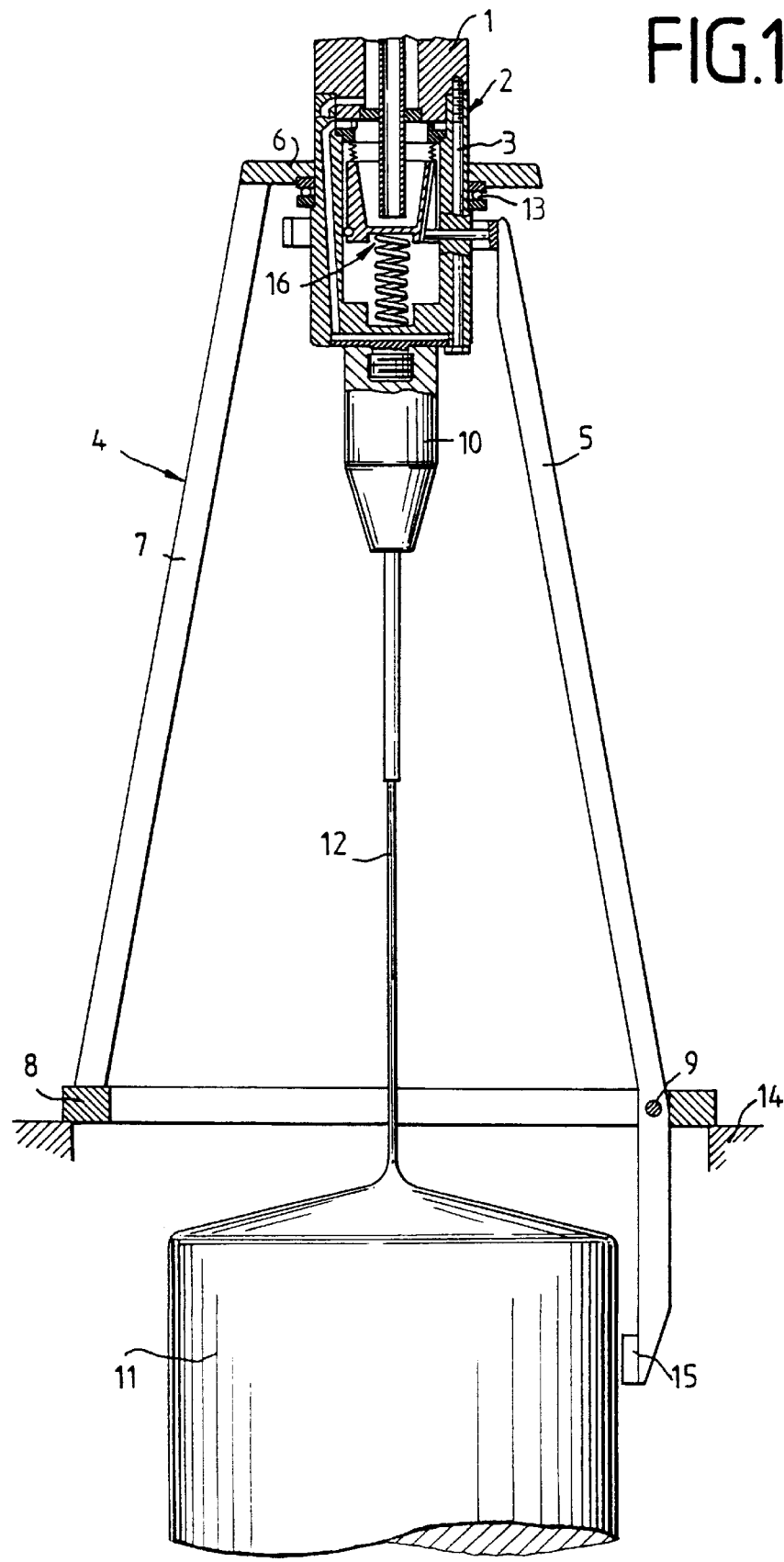
FIG. 1 is a vertical section through a region of a crystal pulling arrangement which is essential for the invention.

As shown in FIG. 1, the apparatus of the invention is a device for holding a crystal block in a crystal pulling arrangement, wherein a vertically displaceable pulling shaft that contains cooling channels for a cooling medium is provided with a seed crystal holder. On this seed crystal holder a crystal neck of smaller diameter and a crystal block of larger diameter are formed during the pulling of the crystal block. The device includes a gripping device (4), with at least two gripping arms (5) that can be placed against the crystal block (11), which is arranged on a pulling shaft (1) in axially displaceable fashion. The device is positionable onto a support from the top. The outer surface or outside of the pulling shaft (1) is fitted with a driver mechanism (13) that can be moved upward against a carrying ring (6) of the gripping device (4) due to the vertical movement of the pulling shaft (1). The pulling shaft (1) is provided with an actuating device (16) for actuating the gripping arms (5).

According to more detailed aspects of the invention, the actuating device (16) contains at least one displaceable actuating piston (18) for increasing the pressure of a cooling medium.

The actuating piston (18) is arranged coaxial to the pulling shaft (1) and contains clamping ramps (23) on its outer surface which extend transverse to a longitudinal axis of the pulling shaft (1). At least one displaceable clamping finger (24) actuates one gripping arm (5) and is arranged radially adjoining a clamping ramp (23) on the actuating piston (18).

Preferably the actuating piston (18) is in the form of a hollow cylinder and only adjoins a guide cylinder (17) near its lower end face such that it can be tilted toward all sides. An upper end of the actuating piston (18) is connected to the guide cylinder (17) in sealed fashion by a bellows (21).

In a still further detailed aspect of the invention, the actuating piston (18) adjoins the guide cylinder (17) with a plurality of balls (20) that are inserted into recesses (19) that are arranged in an outer surface of the actuating piston (18) near its lower end face thereof.

The plurality of support arms (17) extend from the carrying ring (6) of the gripping device (4) to a holding ring (8) arranged its lower end, the holding ring (8) contains articulation axes (9) for one respective gripping arm (5) that contains a pressure element (15) for adjoining a crystal block (11) at the lower end of its lower lever arm and adjoins one respective clamping finger (24) with its upper lever arm.

The guide cylinder (17) with the actuating piston (18), the gripping device (4) and its actuating device (16) form one structural unit together with a pulling shaft extension (2) for fastening on the pulling shaft (1).

Figure 2:
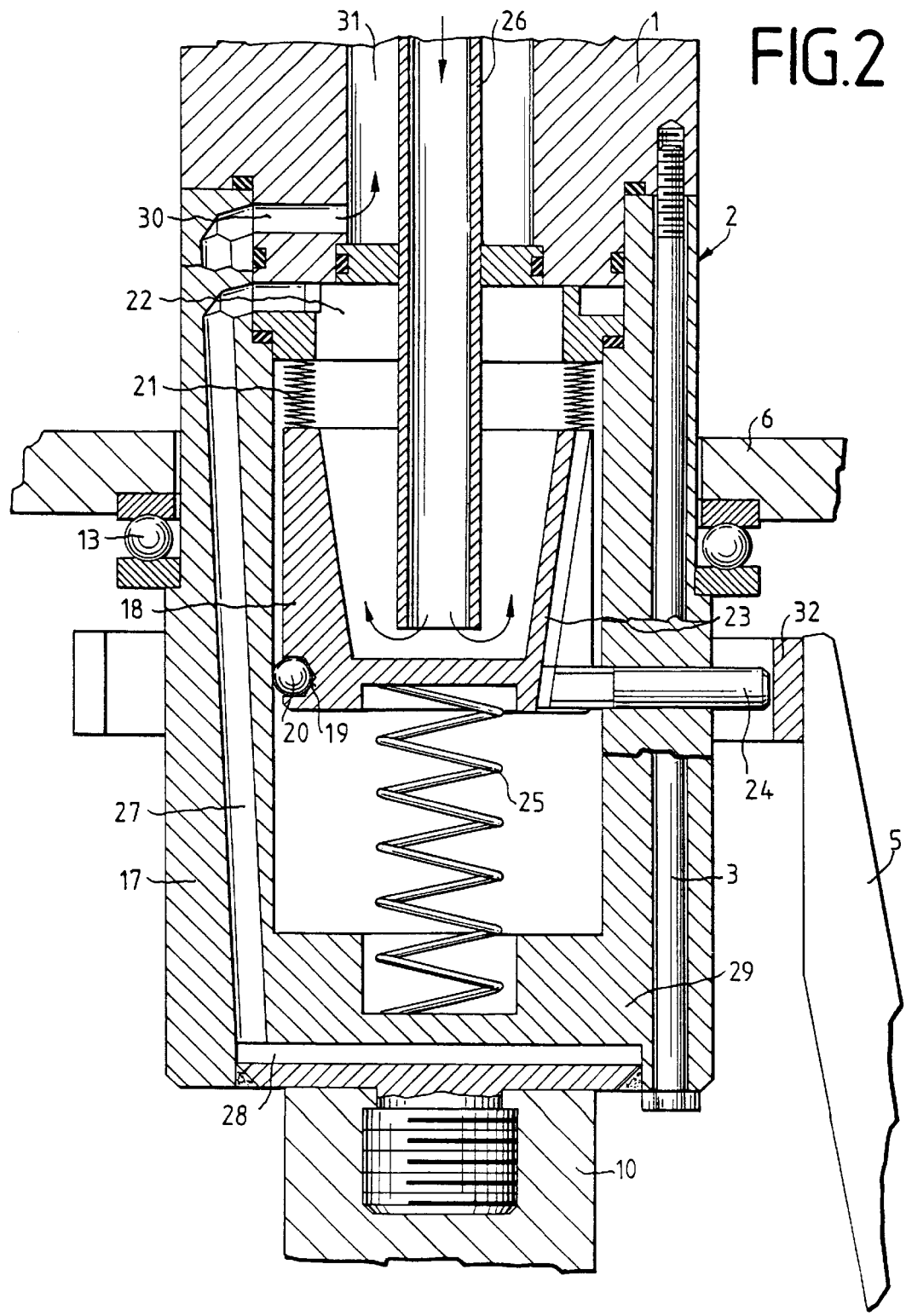
FIG. 2 is a partial sectional view of a region of the device according to FIG. 1 and which is illustrated in enlarged fashion compared to FIG. 1.

As shown in FIG. 2 the guide cylinder (17) is closed by a face wall (29) on its lower side, and a seed crystal holder (10) is inserted into the guide cylinder (17) in order to form a cooling medium chamber (28) at a distance from the face wall (29). Cooling medium chamber (28) is connected to a cooling medium supply (cooling tube 26) via cooling channels (27). The pulling shaft (1) contains a central cooling tube (26) for supplying the cooling medium and the cooling tube (26) extends into the actuating piston (18), into the vicinity of its lower end face. The cooling channels (27) extend from the upper end of the guide cylinder (17) to the cooling medium chamber (28) and from the cooling medium chamber (28) to a return channel (31) that surrounds the cooling tube (26) via additional cooling channels (30).

As also shown, the gripping arms (5) contain crosspieces (32) at the elevation of the clamping fingers (24) which extend toward both sides in the shape of an arc at a distance from the pulling shaft extension (2).

FIG. 1 shows the lower end of a pulling shaft 1, on which a pulling shaft extension 2 is fastened by means of screw 3. This pulling shaft extension 2 holds a gripping device 4 that contains three gripping arms 5 (only one is shown). The gripping device 4 is provided with a carrying ring 6 on its upper side. The pulling shaft 1 extends through this carrying ring 6 with a certain play such that it can be vertically moved by the gripping device 4 in unobstructed fashion. Three support arms 7 (only one is shown) extend from the carrying ring 6 to a lower holding ring 8. This holding ring 8 contains articulation axes 9 (only one is shown) which respectively hold one of the gripping arms 5.

On its lower end face, the pulling shaft extension 2 carries a seed crystal holder 10, on which a crystal block 11 with a crystal neck 12 is suspended. The pulling shaft extension 2 contains a driver 13 that is embodied in the form of a ball bearing arranged underneath the carrying ring 6. In the position shown in FIG. 1, the gripping device 4 is supported on a stationary support 14 with its holding ring 8. The pulling shaft 1 is able to freely move upward until the position shown in FIG. 1 is reached. However, as soon as the driver 13 adjoins the carrying ring 6 from the bottom, the gripping device 4 and the pulling shaft 1 are synchronously raised, and the gripping device is subjected to a rotary movement synchronous to that of the pulling shaft 1. In order to accomplish that the crystal neck 12 needs to carry the full weight of the crystal block 11, the gripping arms 5 can be pivoted about the articulation axes 9 by means of an actuating device 16, in such a way that the pressure element 15 on the lower lever arm of the respective gripping arm 5 adjoins the crystal block 11 and consequently holds said crystal block.

Once a finished crystal block is removed from the device after the pressure of the cooling medium is reduced and the gripping arms 5 are opened, the pulling shaft 1 is moved downward. As soon as the gripping device 4 is again supported on the support 14 with its holding ring 8, its rotational movement ceases.

The design of the pulling shaft extension 2 which is essential for the invention is shown in FIG. 2. This figure shows that the pulling shaft extension 2 contains a guide cylinder 17 that is closed at its lower end, wherein a pot-shaped actuating piston 18 that is open toward the top is arranged inside the guide cylinder 17. Near its lower end face, the outer surface of this actuating piston 18 is provided with a plurality of recesses, for example, four recesses 19 that are arranged at the same elevation. As shown, one respective ball 20 that adjoins in abutting relation the inner surface of the guide cylinder 17 protrudes from one of these four recesses 19. Due to this measure, the actuating piston 18 is only guided in the guide cylinder 17 near its lower end. Since the actuating piston otherwise has a significant play, it is able to tilt toward all sides with its upper end inside of the guide cylinder 17.

The upper end of the actuating piston 18 is connected to the guide cylinder 17 in sealed fashion via a bellow 21 and a ring 22. The outer surface of the actuating piston 18 contains three clamping ramps 23 (one is shown) that are arranged at a distance from the central axis of the device which increases toward the top. As shown, one respective clamping finger 24, the other end of which is supported on the gripping arm 5, adjoins each clamping ramp 23. In the position shown, a compression spring 25 prestresses the actuating piston 18.

FIG. 2 also shows that the gripping arms 5 contain crosspieces 32 at the elevation of the clamping fingers 24 which extend toward both sides in the shape of an arc at a distance from the pulling shaft extension 2. Due to this measure, the clamping fingers 24 do not have to be exactly flush with the gripping arms 5 in order to actuate the gripping arms 5. If a certain angular offset exists, the clamping fingers 24 contact one of the crosspieces 32 and are able to actuate the respective gripping arm 5.

In carrying out the invention, at the beginning of the crystal pulling process, the gripping means 4 rests on the support 14. The pulling shaft 1 is able to move upward to a certain extent without lifting the gripping means 4 from the support 14. As soon as the neck 12 of the crystal block 11 and the first part of the trunk of the crystal block 11 have been formed, the pulling shaft 1 is coupled with the gripping means 4, so that the gripping means moves upward together with the pulling shaft 1. At the same time, the gripping arms 5 of the gripping means are moved against the trunk of the crystal block 11 and clamp the crystal block with the clamp 15 so that on moving the crystal block upwards, the trunk of the crystal block does not weigh on the neck of the crystal block but is supported by the gripping means. The gripping means clamps the crystal block and helps to pull it upwards.

In order to cool the entire arrangement, a cooling tube 26 extends coaxially through the pulling shaft 1, wherein the cooling tube ends a short distance before the lower end face of the actuating piston 18. The cooling medium that is supplied through this cooling tube 26, and usually consists of water, flows upward from the interior of the actuating piston 18 and then downward into a cooling medium chamber 28 via cooling channels 27 arranged in the wall of the guide cylinder 17. This cooling medium chamber is formed between a lower face wall 29 of the guide cylinder 17 and the upper side of the seed crystal holder 10. The cooling medium rises from this cooling medium chamber 28 into a return channel 31 that surrounds the cooling tube 26 via additional cooling channels 30.

Further various and modifications of the foregoing will be apparent to those skilled in the art and are intended to be encompassed by the claims.

German priority application 197 54 961.6 is relied on and incorporated herein by reference.

I claim:

1. A device for holding a crystal block in a crystal pulling arrangement, wherein a vertically displaceable pulling shaft that contains cooling channels for a cooling medium is provided with a seed crystal holder, on which a crystal neck of smaller diameter and a crystal block of larger diameter are formed during pulling of the crystal block, said device comprising a gripping device, with at least two gripping arms that can be placed against the crystal block, arranged on a pulling shaft in an axially displaceable fashion, said gripping device being positionable onto a top of a support, an outer side of the pulling shaft containing a driver that can be moved against a carrying ring of the gripping device due to vertical movement of the pulling shaft, the pulling shaft being provided with an actuating device for actuating the gripping arms, and wherein the actuating device contains at least one displaceable actuating piston for increasing a pressure of the cooling medium.

2. The device according to claim 1, wherein the actuating device contains only one actuating piston that is arranged coaxial to the pulling shaft and contains clamping ramps on its outer surface which extend transverse to a longitudinal axis of the pulling shaft, wherein a respective displaceable clamping finger that actuates one gripping arm is arranged radially adjoining one of the clamping ramps on said actuating piston.

3. The device according to claim 2, wherein the actuating piston is in the form of a hollow cylinder and only adjoins a guide cylinder near its lower end face such that it can be tilted toward any side, wherein an upper end of the actuating piston is connected to the guide cylinder in a sealed fashion by a bellows.

4. The device according to claim 3, wherein the guide cylinder with the actuating piston, the gripping device and its actuating device form one structural unit together with a pulling shaft extension for fastening on the pulling shaft.

5. The device according to claim 3, wherein the guide cylinder is closed by a face wall on its lower side, a seed crystal holder is inserted into the guide cylinder in order to form a cooling medium chamber at a distance from the face wall, and the cooling medium chamber is connected to a cooling medium supply via cooling channels.

6. The device according to claim 5, wherein the pulling shaft contains a central cooling tube for supplying the cooling medium, said cooling tube extending into the actuating piston, into a vicinity of its lower end face, and the cooling channels extending from an upper end of the guide cylinder to the cooling medium chamber and from the cooling medium chamber to a return channel that surrounds the cooling tube via additional cooling channels.

7. The device according to claim 3, wherein the actuating piston adjoins the guide cylinder with a plurality of balls that are inserted into recesses arranged in an outer surface of the actuating piston near the lower end face thereof.

8. The device according to claim 1, wherein a ball bearing that can be moved against the carrying ring at its bottom is arranged on the pulling shaft as the driver.

9. The device according to claim 1, wherein a plurality of support arms extend from the carrying ring of the gripping device to a holding ring arranged at a lower elevation, said holding ring containing articulation axes for one respective gripping arm, wherein a lower end of the gripping arm contains a pressure element for adjoining a crystal block, and wherein an upper end of the gripping arm adjoins a respective clamping finger.

10. The device according to claim 1, wherein the gripping arms contain crosspieces at an elevation of the clamping fingers which extend toward both sides in the shape of an arc at a distance from a pulling shaft extension fastened to the pulling shaft.

11. A method for holding a crystal block in a crystal pulling arrangement, comprising positioning gripping means over a melt that forms the crystal, wherein a vertically displaceable pulling shaft is provided with a seed crystal holder, on which a crystal neck of a smaller diameter and a crystal block of larger diameter are formed during the pulling of the crystal block, coupling said pulling shaft with said gripping means, moving said pulling shaft upward to draw the crystal neck and crystal block in an upward direction, clamping said crystal block so that on moving the crystal block upwards, said crystal block does not weigh on the crystal neck and supporting said crystal block by clamping means attached to said gripping means.

* * * * *